United States Patent
Gupta et al.

(10) Patent No.: US 11,498,449 B1
(45) Date of Patent: Nov. 15, 2022

(54) CHARGING APPARATUS AND METHODS TO SUPPORT MULTIPLE CHARGING DEVICES

(71) Applicant: Motiv Power Systems, Inc., Foster City, CA (US)

(72) Inventors: Shivam Gupta, Foster City, CA (US); James Michael Castelaz, Alameda, CA (US)

(73) Assignee: Motiv Power Systems, Inc., Foster City, CA (US)

(*) Notice: Subject to any disclaimer, the term of this patent is extended or adjusted under 35 U.S.C. 154(b) by 582 days.

(21) Appl. No.: 16/589,059

(22) Filed: Sep. 30, 2019

Related U.S. Application Data (60) Provisional application No. 62/739,109, filed on Sep. 28, 2018.

(51) Int. Cl.

| | |
|---|---|
| *B60L 58/10* | (2019.01) |
| *B60L 53/16* | (2019.01) |
| *B60L 53/63* | (2019.01) |
| *B60L 53/30* | (2019.01) |
| *H01M 10/44* | (2006.01) |
| *B60L 53/18* | (2019.01) |
| *H03K 7/08* | (2006.01) |
| *B60W 10/24* | (2006.01) |
| *B60L 53/22* | (2019.01) |

(52) U.S. Cl.
CPC .............. *B60L 58/10* (2019.02); *B60L 53/16* (2019.02); *B60L 53/18* (2019.02); *B60L 53/22* (2019.02); *B60L 53/305* (2019.02); *B60L 53/63* (2019.02); *B60W 10/24* (2013.01); *H01M 10/44* (2013.01); *H03K 7/08* (2013.01); *B60W 2710/24* (2013.01)

(58) Field of Classification Search
CPC .......... B60L 58/10; B60L 53/16; B60L 53/18; B60L 53/63; H01M 10/44; H03K 7/08
USPC ......................................... 701/22; 320/109
See application file for complete search history.

(56) References Cited

U.S. PATENT DOCUMENTS

| | | | |
|---|---|---|---|
| 10,249,912 B1* | 4/2019 | Godo | .................. B60R 16/0232 |
| 2012/0181983 A1* | 7/2012 | Khan | ...................... B60L 53/14 |
| | | | 320/109 |

\* cited by examiner

*Primary Examiner* — Nathaniel R Pelton
(74) *Attorney, Agent, or Firm* — Adibi IP Group, PC; Amir V. Adibi; Andrew C. Palmer (57) ABSTRACT

Charging apparatus and methods are provided that support multiple charging devices. In an embodiment, a charging apparatus includes a secondary signal generator (SSG) and an output circuit. The SSG receives charging control signals and generates one or more secondary charging control signals. The output circuit outputs the charging control signals to a primary charging device and the one or more secondary charging control signals to one or more secondary charging devices, thereby enabling the use of multiple charging devices in battery applications. In an embodiment, the secondary charging signals are pulse width modulated to control the current output of the secondary charging devices to avoid over-current conditions.

15 Claims, 9 Drawing Sheets

| | Voltage | Phase | Peak Current | Power |
|---|---|---|---|---|
| AC Level 1 | 120 volts | Single phase | 16 A | 1.92 kW |
| AC Level 2 | 208 volts | Leg to leg of a 208Y/120V 3-phase | 48 A | 9.98 kW |
| AC Level 2 | 240 volts | Split phase | 30 A<br>32 A (2001)<br>80 A (2009) | 7.20 kW<br>7.68 kW<br>19.20 kW |

Standard J1772 Plug and Receptacle

FIG. 8

| VAC 3-phase | IEC Standard Contacts 63A coupler | J3068 Advanced contacts | | |
|---|---|---|---|---|
| | | 100A AC coupler | 120A AC coupler | 160A AC coupler |
| 120/208 | 22.7 kW | 36.0 kW | 43.2 kW | 57.6 kW |
| 277/480 | 22.7 kW | 83.1 kW | 99.7 kW | 133 kW |
| 347/600 | 22.7 kW | 104.1 kW | 124.9 kW | 166 kW |

3-Phase AC and DC Fast Charging Connectors

FIG. 9

CHARGING APPARATUS AND METHODS TO SUPPORT MULTIPLE CHARGING DEVICES

CROSS REFERENCE TO RELATED APPLICATIONS

This application claims the benefit under 35 U.S.C. § 119 from U.S. Provisional Patent Application Ser. No. 62/739,109, entitled "Charging Apparatus And Methods," filed on Sep. 28, 2018, the subject matter of which is incorporated herein by reference.

TECHNICAL FIELD

The described embodiments relate to vehicle charging devices.

BACKGROUND INFORMATION

Electric vehicles are gaining widespread acceptance in both public and private sectors. These vehicles includes both electric and hybrid vehicles. Both vehicle types require a charging solution and often come with an on-board charger to charge batteries and power accessory devices.

Figure 1:
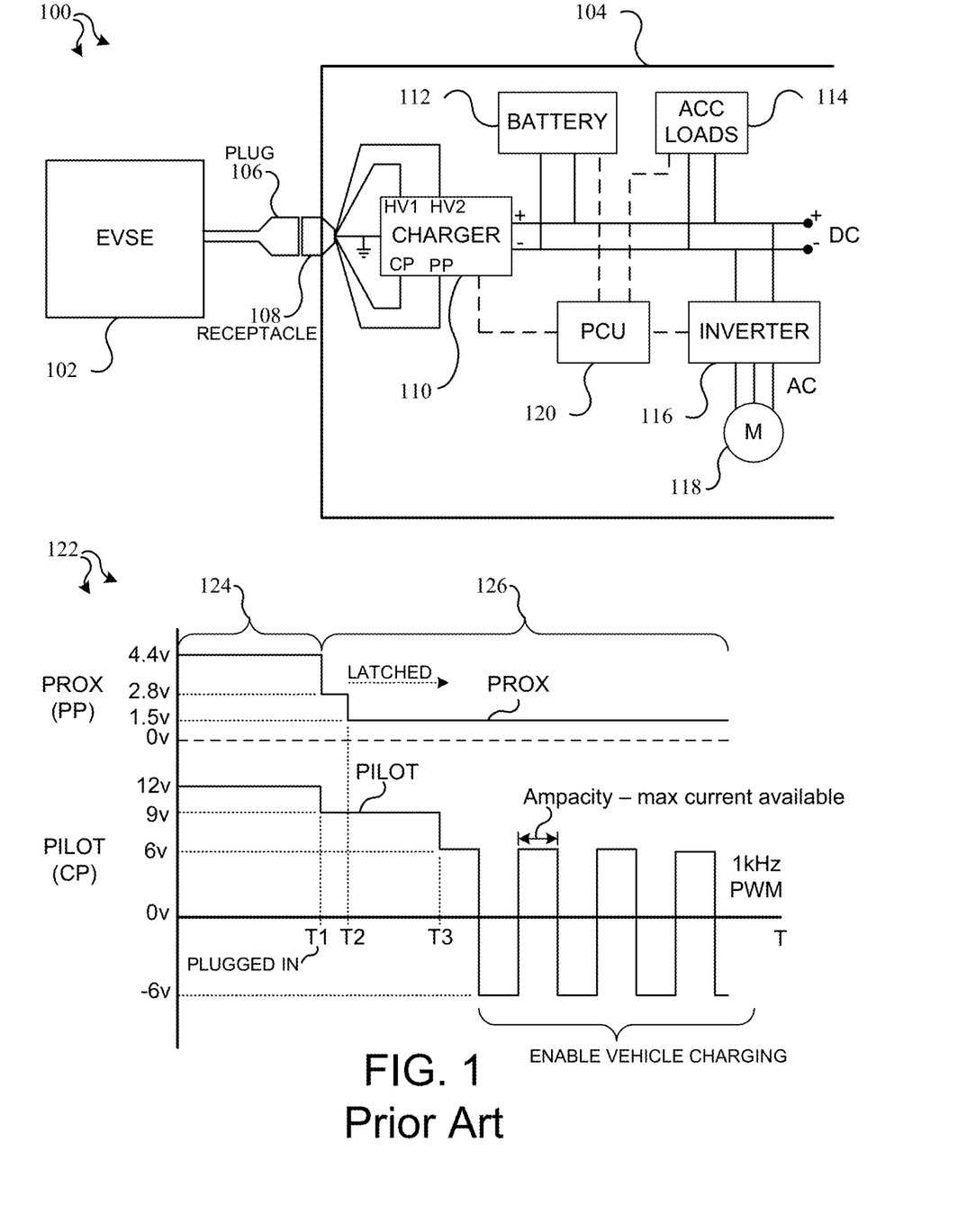
FIG. 1 shows a conventional charging configuration for use in an electric vehicle.

FIG. 1 shows a conventional charging configuration 100 that is used in a vehicle. An electric vehicle supply equipment (EVSE) 102 provides power that can be used by charger 110 to charge batteries or a battery pack 112 in vehicle 104. Typically, power from the EVSE 102 is provided through a cable that has an attached plug 106, such as a plug that is part of a Society of Automobile Engineers (SAE) J1772 connector. A matching receptacle 108 is provided at the vehicle 104. When the plug and receptacle are attached, signals flow between the EVSE equipment 102 and a vehicle charger 110. For example, these signals include two high voltage signals (HV1, HV2), an earth ground, a control pilot (CP) signal, and a proximity pilot (PP) signal. The PP signal is also referred to as a "Proximity" or "Prox" signal. The CP signal is also referred to as a "Pilot" signal.

The Prox signal indicates when the EVSE 102 is attached to a vehicle 104 (e.g., by plug 106 and receptacle 108). The Pilot signal indicates when the EVSE 102 is providing charging power through the HV1 and HV2 signals.

Timelines 122 illustrate the operation of the Prox and Pilot signals during the charging process. During time interval 124, the EVSE 102 is disconnected from the vehicle 104. For example, the connectors 106 and 108 are unconnected. During this interval, the Prox signal is maintained at approximately 4.4 volts and the Pilot signal at 12 volts. At time T1, the plug 106 and receptacle 108 are connected as indicated by time interval 126. The Prox signal is pulled down to 2.8 volts and then at time T2, the Prox signal is pulled down and latched at 1.5 volts. At time T1, the charger 110 pulls the Pilot signal down to 9 volts.

At time T3, the charger 110 is ready to start charging and pulls the Pilot signal down to 6 volts to indicate that the charger 110 is ready to accept charging power. The EVSE 102 responds by placing a 1 kHz pulse width modulated (PWM) signal on the Pilot signal. This PWM Pilot signal indicates to the charger 110 that the EVSE 102 is providing charging power on the high voltage (HV1, HV2) lines. The pulse width of the PWM Pilot indicates ampacity that identifies when the maximum charging current is available to the charger 110.

After the EVSE 102 starts providing charging power to the vehicle 102, the charger 110 converts the received high voltage signals (HV1, HV2) to a DC output that is connected to the battery 112 and other devices, such as accessory loads 114. The operation of the charger 110 is monitored by a control unit (PCU) 120.

SUMMARY

In various exemplary embodiments, a charging apparatus for use in a vehicle is provided. In one embodiment, the charging apparatus includes a secondary signal generator that generates secondary charging control signals. Multiple sets of secondary charging control signals are provided to multiple chargers, respectively. If a charger failure occurs, other chargers are still able to function properly by using the secondary signals. The failed charger can be easily replaced without expensive modifications or system redesign.

In another embodiment, a charging apparatus includes a secondary signal generator (SSG) and an output circuit. The SSG receives charging control signals and generates one or more secondary charging control signals. The output circuit outputs the charging control signals to a primary charging device and the one or more secondary charging control signals to one or more secondary charging devices, thereby enabling the use of multiple charging devices. In one example, the secondary charging signals are pulse width modulated to control the current output of the secondary charging devices to avoid over-current conditions.

In another embodiment, an apparatus is provided that comprises a buffer circuit that receives a first proximity signal and generates one or more secondary proximity signals. The apparatus also comprises a comparator circuit that receives a first pilot signal and generates one or more secondary pilot signals. The apparatus also comprises output terminals that output the first proximity signal and the first pilot signal to a first charger, and that output the one or more secondary proximity signals and pilot signals to one or more additional chargers.

In yet another embodiment, a method is provided that comprises receiving charging control signals and generating one or more secondary charging control signals from the charging control signals. The method also includes outputting the charging control signals to a primary charging device, and outputting the one or more secondary charging control signals to one or more secondary charging devices.

In yet another embodiment, a method is provided that comprises distributing high voltage signals from an EVSE to multiple chargers that include a master charger and secondary chargers. The method also comprises distributing pilot and proximity signals to the master charger. The method also comprises generating secondary pilot and secondary proximity signals from the pilot and proximity signals, and distributing the secondary pilot and secondary proximity signals to one or more secondary chargers.

The foregoing is a summary and thus contains, by necessity, simplifications, generalizations and omissions of detail; consequently it is appreciated that the summary is illustrative only. Still other methods, and structures and details are set forth in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

In various embodiments, a charging apparatus is provided for use in a vehicle. Reference will now be made in detail to some embodiments of the charging apparatus, examples of which are illustrated in the accompanying drawings.

Figure 2:
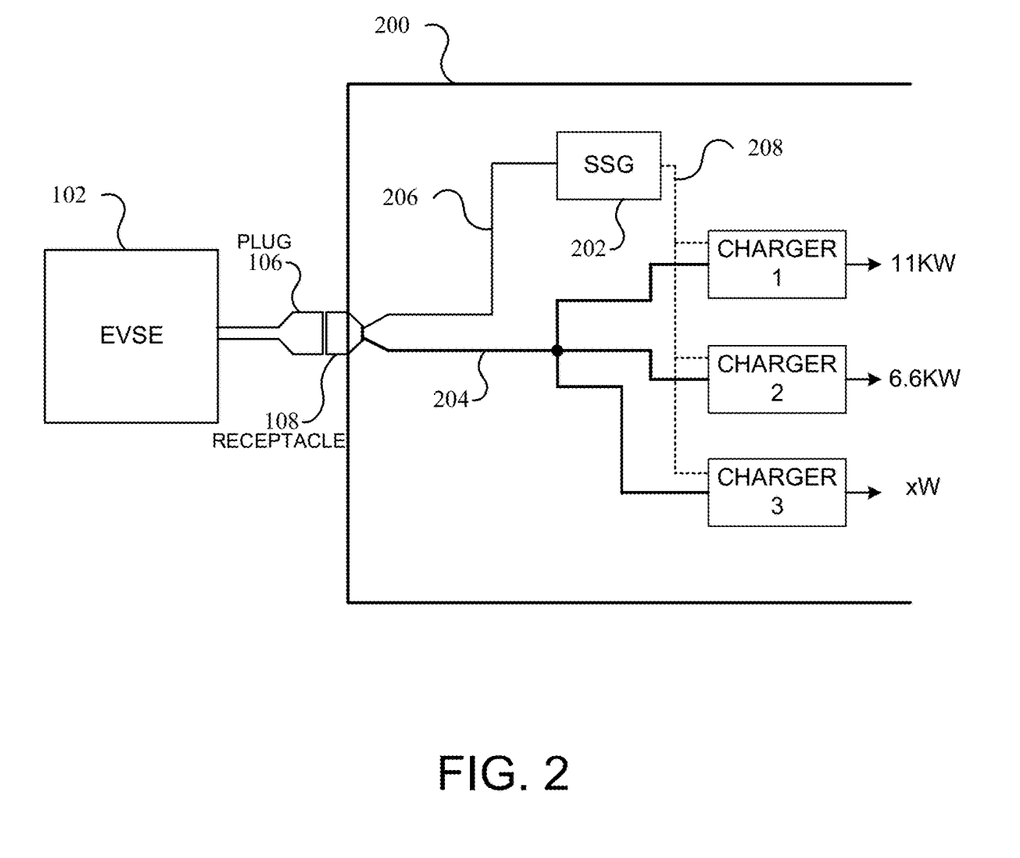
FIG. 2 shows an exemplary embodiment of a charging apparatus for use in an electric vehicle.

FIG. 2 shows one embodiment of a charging apparatus 200 for use in a vehicle. In this embodiment, the charging apparatus 200 comprises a secondary signal generator (SSG) 202, charger 1, charger 2, and charger 3. Each charger outputs a DC signal at a designated power capacity.

The five signal lines (HV1, HV2, GND, PP, CP) received at the receptacle 108 (see FIG. 1) are separated. The high voltage signals (HV1 and HV2) 204 are distributed to the three chargers. The signal lines (PP, CP, and GND) 206 are passed to the SSG 202.

The SSG 202 receives the signal lines 206 and generates two groups of secondary control signals, such that three groups of control signals (indicated at 208) are distributed to the three chargers. For example, the three groups comprise the original group of control signals and the two secondary groups of control signals. Each group of control signals controls the operation of a particular charger to supply the designated output power. In other embodiments, more or less groups of secondary control signals are generated to control more or less chargers.

In various embodiments, the charging apparatus 200 provides significant advantages over the conventional charging configuration shown in FIG. 1. For example, the apparatus 200 includes three chargers that can be selectively enabled in the case of a single charger failure. Also, the apparatus 200 can be implemented with off-the-shelf chargers, which can be easily replaced in the case of a failure without requiring system modification or redesign. Additional descriptions and benefits of the charging apparatus 200 are provided in the following exemplary embodiments.

Figure 3:
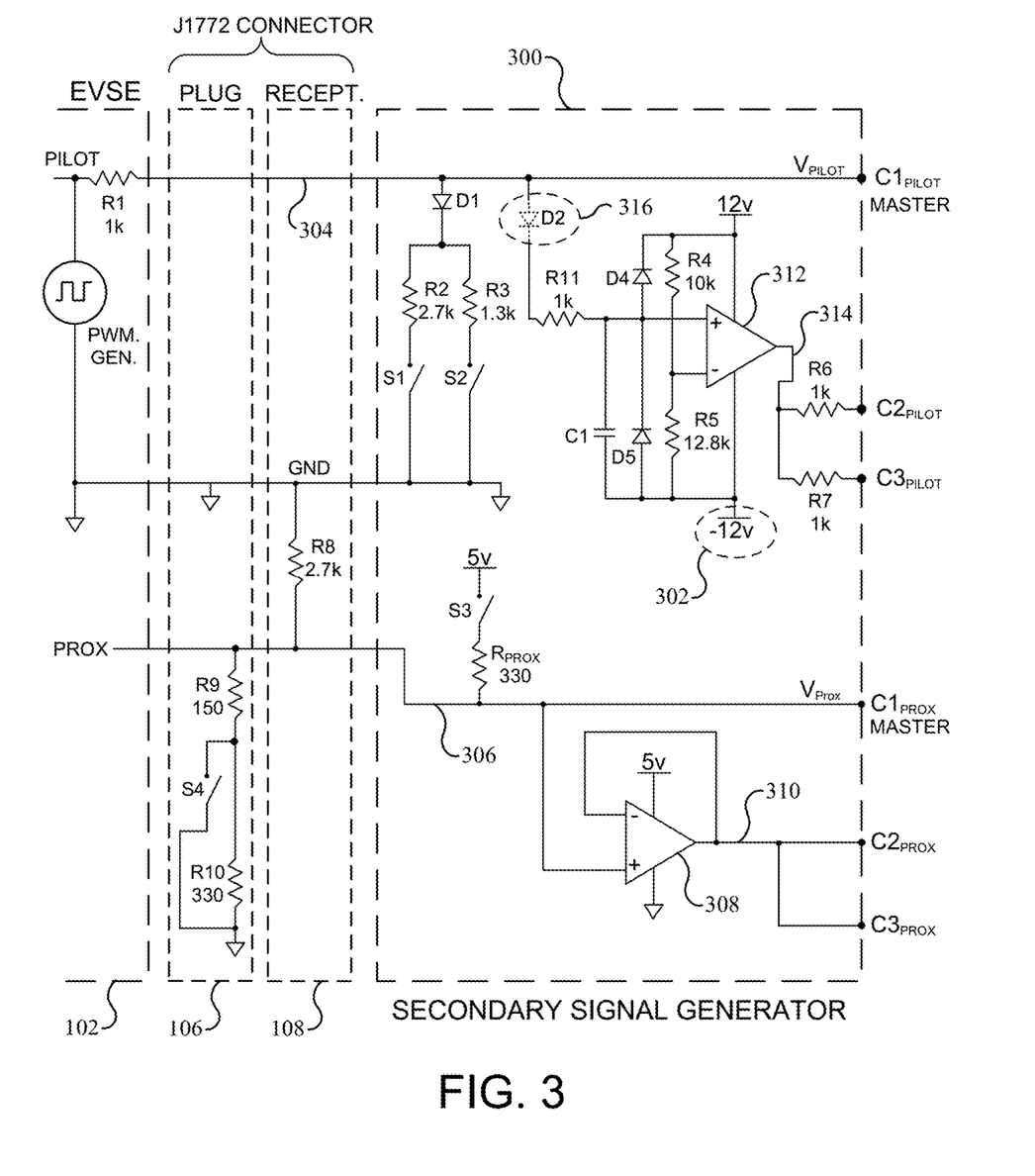
FIG. 3 shows an exemplary embodiment of a secondary signal generator for use in the PCU of the charging apparatus shown in FIG. 2.

FIG. 3 shows one embodiment of a secondary signal generator (SSG) 300 for use in the charging apparatus 200 shown in FIG. 2. For example, the SSG 300 is suitable for use as the SSG 202 shown in FIG. 2. The SSG 300 comprises circuitry that generates secondary Prox signals and secondary Pilot signals.

As shown in FIG. 3, the EVSE 102 is connected to the SSG 300 by plug 106 and receptacle 108, which together form an SAE J1772 connector. The EVSE 102 provides the Pilot signal 304 through resistor R1 to the SSG 300. The EVSE 102 also provides the Prox signal 306 to the SSG 300. The Pilot and Prox signals have voltage levels and timing as illustrated in FIG. 1. The EVSE 102 also provides a ground signal (GND) to the SSG 300.

The receptacle 108 comprises resistor R8 that couples the Prox signal 306 to ground when the plug 106 and receptacle 108 are connected. The Prox signal 306 has a direct path from the input of the SSG 300 to the terminal $C1_{PROX}$. Thus, the received Prox signal 306 flows directly to charger C1, which may be referred to as the "master" charging unit.

The Prox signal 306 is also connected to a non-inverting input of a buffer 308. The buffer 308 has its output terminal tied to its inverting input terminal, which results in the buffer 308 acting as a voltage follower. Thus, the Prox signal 306 at the non-inverting terminal also appears as a secondary Prox signal 310 at the output terminal of the buffer 308. The secondary Prox signal 310 is directly connected to the terminals $C2_{PROX}$ and $C3_{PROX}$. Thus, the received Prox signal 306 is passed directly to charger C1 and secondary Prox signals are passed to chargers C2 and C3.

The Pilot signal 304 has a direct path from the input of the SSG 300 to the terminal $C1_{PILOT}$. Thus, the received Pilot signal 304 flows directly to charger C1 (master).

The Pilot signal 304 also flows through resistor R11 to a non-inverting input of a comparator 312. The comparator 312 has its non-inverting input coupled to ground by capacitor C1 and diode D5. The non-inverting input is also coupled to a 12 volt supply by diode D4. The resistor R11 and capacitor C1 provide filtering of the Pilot signal flowing to the non-inverting comparator input. The diode D5 protects the non-inverting comparator input from large negative voltages and the diode D4 protects the non-inverting comparator input from large positive voltages greater than 12 volts.

Resistors R4 and R5 act as a voltage divider to set a particular voltage at the inverting input of the comparator 312. For example, in one embodiment, the voltage is set in the range of 1.5 to 2.0 volts. In an exemplary embodiment, the resistor R4 is set to 10K and the resistor R5 is set to 12.8K.

In this embodiment, the comparator 312 is connected to −12 volts, as indicated at 302. However, in other embodiments, this −12 volt connection is replaced with a connection to ground. When a ground connection is used, an optional diode D2 (shown at 316) may also be used to protect the Pilot signal 304.

During operation, the Pilot signal 304 at the comparator's non-inverting input can be at 12V, 9V (1 kHz PWM), 6V (1 kHz PWM) or 3V (1 kHz PWM). For the embodiment that uses diode D2 316, the 1.5 to 2.0 voltage level at the inverting input will cause the comparator to generate a secondary Pilot signal 314 at the comparator output. This secondary Pilot signal 314 flows through resistors R6 and R7 to the terminals $C2_{PILOT}$ and $C3_{PILOT}$.

Thus, the comparator 312 generates a secondary Pilot signal 314 from the received Pilot signal 304. The received Pilot signal 304 is passed directly to charger C1, and the secondary Pilot signal 314 is output to chargers C2 and C3. Thus, in this embodiment, the duty cycle of the secondary pilot signal read by a slave charger is the same as the duty cycle of the pilot signal read by the master charger.

Safety and Override Features

The SSG 300 includes some additional safety and override features. In one embodiment, the switch S3 operates to selectively connect the Prox signal 306 to 5 volts. For example, in an exemplary embodiment, the switch S3 can be used if the master charger does not have the capability to connect the Prox line to 5V (or if the line is broken) and it is still desired to use the slave chargers. Because of how the slave chargers are connected to the Prox line through the buffer 308, they do not have the capability to connect the Prox line to 5V, so switch S3 substitutes for that capability, which is lost due to the buffering.

The switches S1 and S2 are there to duplicate the functionality of the master charger since only the master charger can connect the pilot line to those resistances. If the master charger fails, the switches S1 and S2 can adjust the Pilot signal 304 as described herein. For example, closing switch S1 will enable the diode D1 and the resistor R2 to pull down the voltage level of the Pilot signal 304. Closing switch S2 will enable the diode D1 and the resistor R3 to pull down the voltage level of the Pilot signal 304. Thus, selectively closing switches S1 and S2 will simulate the Pilot voltage levels as shown in FIG. 1 to cause the EVSE 102 to activate the PWM mode of the Pilot signal 304. Although the master charger may be disabled, the secondary Pilot signal 314 will cause chargers 2 and 3 to operate normally. Thus, a failure of the master charger can be overridden to enable operation of chargers 2 and 3. All switches shown can be either mechanical switches or electrical switches that can be manually or remotely controlled.

Figure 4A:
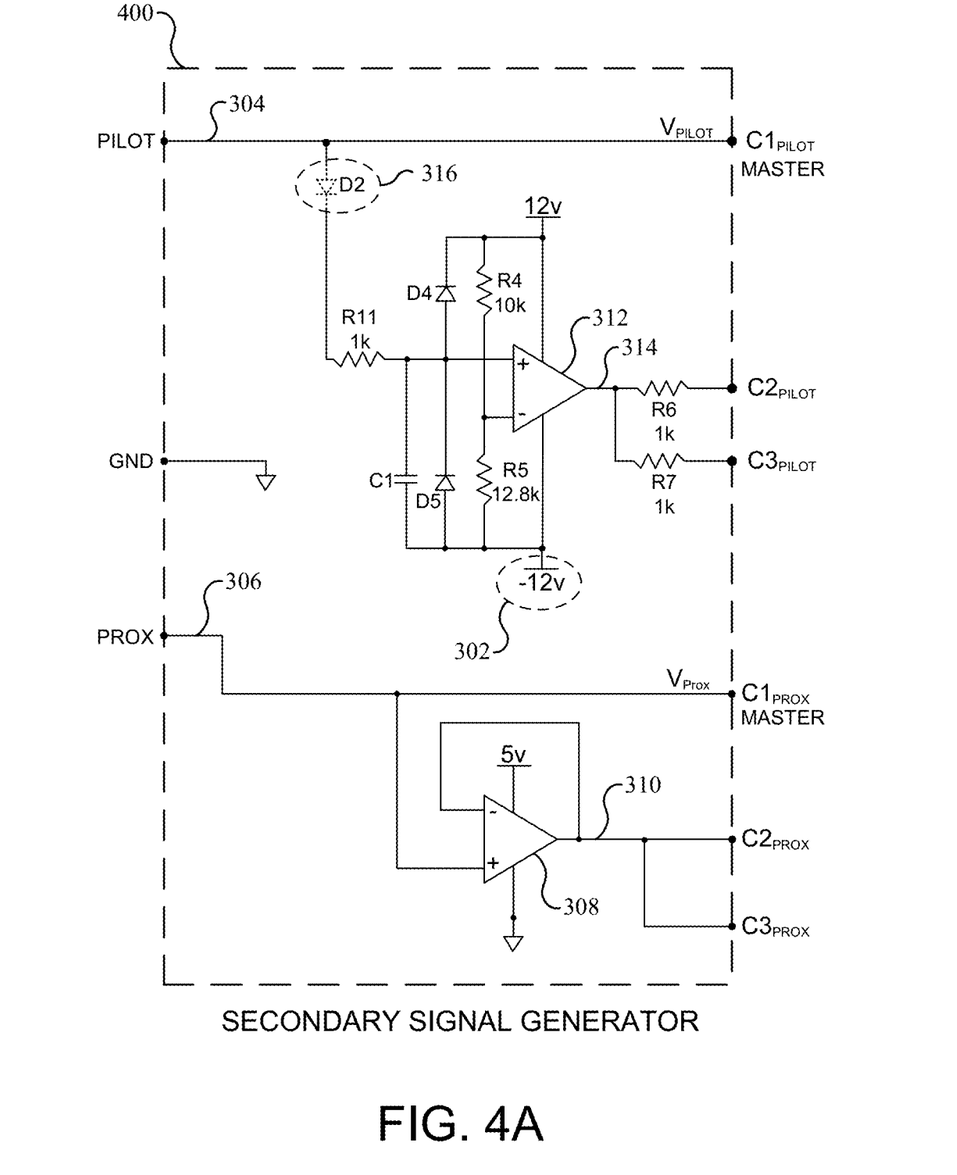
FIG. 4A shows an exemplary embodiment of an alternative secondary signal generator for use in the charging apparatus shown in FIG. 2.

FIG. 4A shows an embodiment of an alternative SSG 400 for use in the charging apparatus 200 shown in FIG. 2. The SSG 400 is identical to the SSG 300 except that the safety and override features have been removed. For example, diode D1, switches S1, S2 and S2, and resistors R2, R3, and R$_{PROX}$ are removed. In an exemplary embodiment, these components are included on another section of the charging apparatus 200. By moving these components, the SSG 400 is less costly and has a smaller footprint than the SSG 300.

Figure 4B:
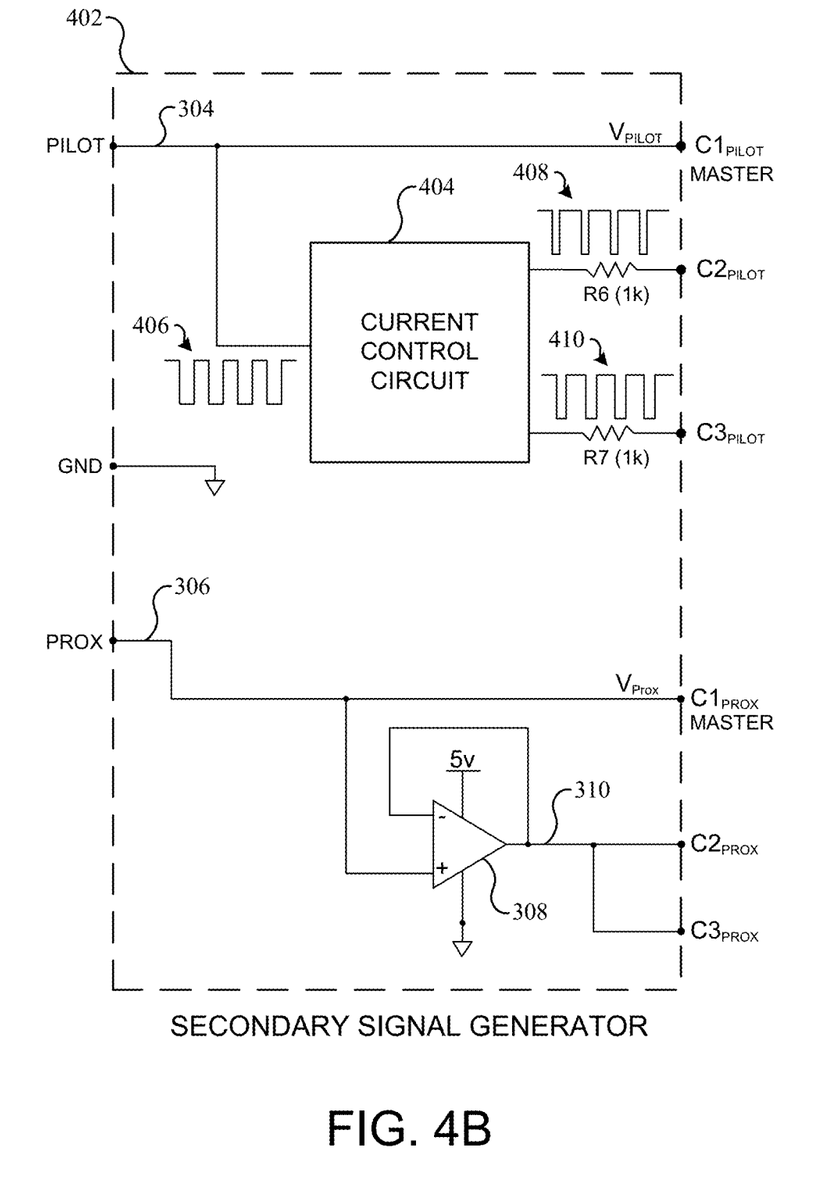
FIG. 4B shows an exemplary embodiment of an alternative secondary signal generator for use in the charging apparatus shown in FIG. 2.

FIG. 4B shows another embodiment of an alternative SSG 402 for use in the charging apparatus 200 shown in FIG. 2. The SSG 402 is identical to the SSG 300 except that the safety and override features have been removed. For example, diode D1, switches S1, S2 and S2, and resistors R2, R3, and R$_{PROX}$ are removed. In an exemplary embodiment, these components are either removed or are included on another section of the charging apparatus 200. By moving these components, the SSG 400 is less costly and has a smaller footprint than the SSG 300.

The SSG 402 is also different from the SSG 300 in that the comparator 312 and its supporting circuitry has been replaced with a current control circuit 404. In exemplary embodiments, the current control circuit 404 includes any one or a combination of a CPU, processor, gate array, state machine, controller, firmware, buffers, comparators, logic circuits, memory, and/or discrete components.

The current control circuit 404 senses the maximum current available from the EVSE by monitoring the duty cycle of the PWM 406 of the Pilot signal 304. The current control circuit 404 also generates secondary pilot signals, but is able to control the PWM duty cycle of each of these secondary pilot signals so that the corresponding chargers operate at selected current levels. For example, the current control circuit 404 generates the C2 pilot to have a particular PWM duty cycle 408 that controls the current provided by charger 2, and the current control circuit 404 generates the C3 pilot to have a particular PWM duty cycle 410 that controls the current provided by charger 3. Thus, the current control circuit 404 is able to determine the maximum current available from the EVSE and to set the current for each charger based on the maximum available. For example, in one embodiment, the sum of the maximum currents for all of the chargers is set to be at or below the maximum current available from the EVSE. Therefore, the possibility of drawing more current from the array of chargers than the EVSE can provide can be avoided.

Figure 5:
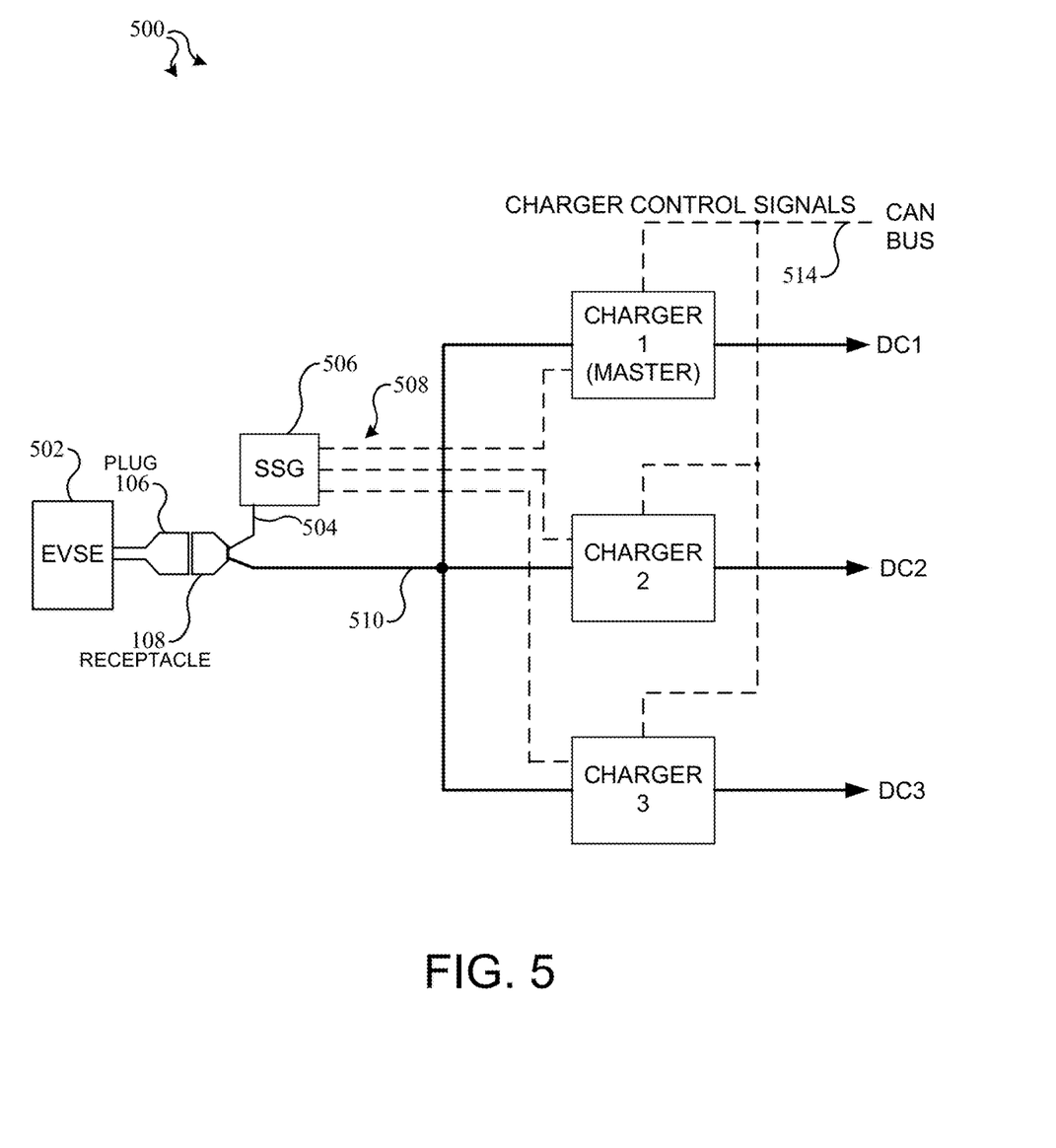
FIG. 5 shows a charging configuration that utilizes an exemplary embodiment of a secondary signal generator.

FIG. 5 shows a charging configuration 500 that utilizes an exemplary embodiment of a secondary signal generator 506. The charging configuration 500 comprises an EVSE 502 that provides charging power via a plug 106 and receptacle 108 that form a J1772 connector.

In an exemplary embodiment, the receptacle 108 receives high voltage signals (HV1, HV2) and distributes these signals to charger 1, charger 2, and charger 3, as indicated at 510. The receptacle 108 receives the control signals (CP, PP, and GND) and distributes these signals to the SSG 506, as indicated at 504.

In an exemplary embodiment, the SSG 300 shown in FIG. 3 is suitable for use as the SSG 506. In this embodiment, the SSG 506 generates two sets of secondary Prox and Pilot signals and distributes the original and the secondary Prox and Pilot signals to the corresponding chargers as indicated at 508.

During operation, the three chargers (1, 2, 3) convert the HV inputs they receive to DC output voltages that are output to perform various charging functions in a vehicle.

The chargers are also coupled to a CAN BUS 514 to communicate charger control signals with a central vehicle controller.

Figure 6:
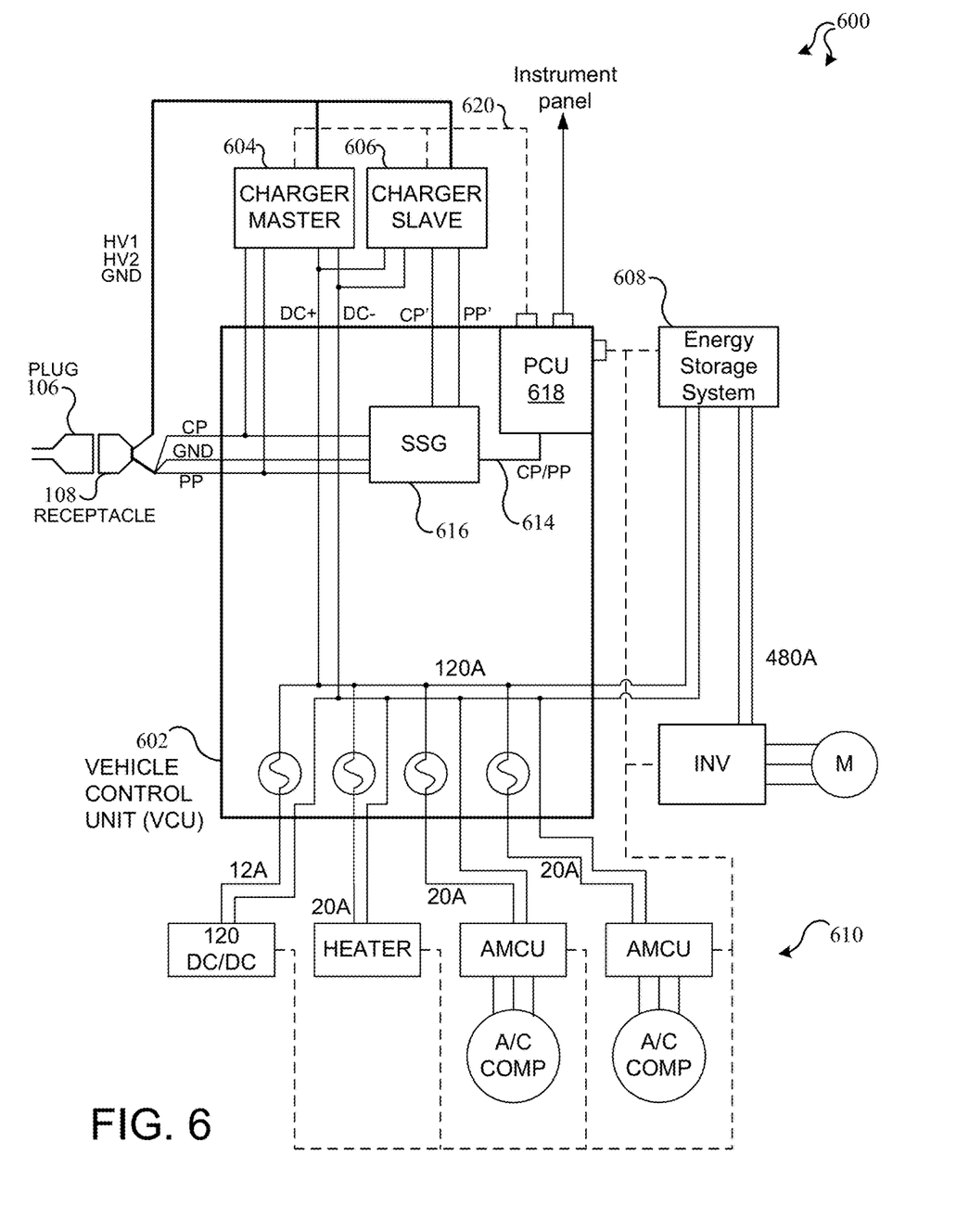
FIG. 6 shows an alternative charging configuration that utilizes an exemplary embodiment of a secondary signal generator.

FIG. 6 shows an alternative charging configuration 600 that utilizes an exemplary embodiment of a secondary signal generator 616. The charging configuration 600 comprises vehicle control unit (VCU) 602, master charger 604, slave charger 606, energy storage system 608, and accessories 610. It should be noted that "AMCU" stands for "Auxiliary Motor Control Unit", "M" stands for "Motor", "Inv" stands for "Inverter", "A/C Comp" stands for "Air Conditioning Compressor Motor", and "PCU" stands for "Powertrain Control Unit."

The VCU 602 is connected to an EVSE (not shown) by plug 106 and receptacle 108. The five signal lines provided at the receptacle 108 are selectively distributed to the chargers (604, 606) and SSG 616. For example, the two high voltage (HV1, HV2) signal lines are distributed to the chargers 604 and 606. The CP and PP signals are input to the master charger 604 and the SSG 616. The SSG 616 may be configured as the SSG 300 shown in FIG. 3. The SSG 616 uses the received CP and PP signals to generate secondary Pilot (CP') and Prox (PP') signals that are input to the slave charger 606. Thus, the SSG 616 replicates the received control signals to drive the slave charger 606.

The VCU 602 comprises PCU 618 that receives the CP and PP signals 614 and other information from the energy storage system 608, such as state of charge (SOC), state of health (SOH), temperature, and other system factors, such as desired vehicle charge completion time, etc. The PCU 618 uses all the information received to control the current output of the chargers 604 and 606 through control bus 620. The various information collected by the PCU 618 and used to control the current output of the chargers 604 and 606 protects against over-currenting the batteries in the energy storage system 608 as they begin to be fully charged. The chargers 604 and 606 output DC signals that power the accessories 610 and/or other vehicle devices.

In an exemplary embodiment, the PCU 618 determines the maximum current available from the EVSE by monitoring the CP and PP signals 614. The PCU 618 then controls the chargers 604 and 606 using control bus 620 to set the current output from each charger based on the maximum current available.

Figure 7:
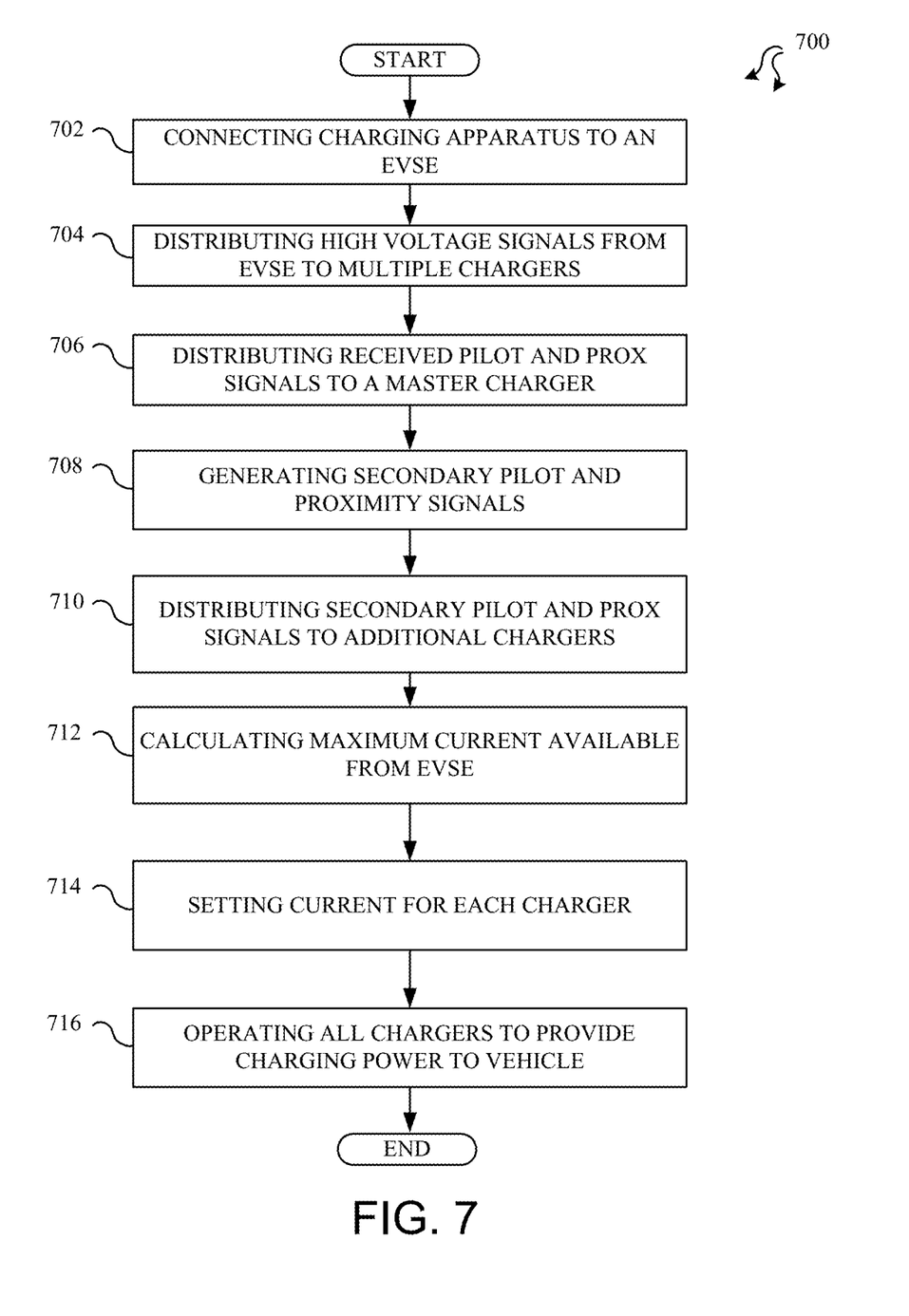
FIG. 7 shows an exemplary embodiment of a method for operating multiple chargers in a vehicle.

FIG. 7 shows an embodiment of a method 700 for operating multiple chargers in a vehicle. For example, the method 700 is suitable for use with the charging apparatuses shown in FIG. 2, FIG. 5, and FIG. 6.

At block 702, a charging apparatus is connected to an EVSE. For example, as illustrated in FIG. 2, the EVSE 102 is connected to the charging apparatus 200 by plug 106 and receptacle 108.

At block 704, high voltage signals from the EVSE are distributed to multiple chargers that include a master charger. For example, the HV signals 204 are distributed to chargers 1-3.

At block 706, Pilot and Prox signals from the EVSE are distributed to a master charger. For example, as illustrated in FIG. 3, the Pilot 304 and Prox 306 signals are distributed directly to the charger 1 (master).

At block 708, secondary Prox and Pilot signals are generated. For example, as illustrated in FIG. 3, the buffer 308 generates the secondary Prox signal 310 from the Prox signal 306, and the comparator 312 generates the secondary Pilot signal 314 from the Pilot signal 304.

At block 710, the secondary Prox and Pilot signals are distributed to additional chargers. For example, as illustrated in FIG. 3, the secondary Pilot 314 and the secondary Prox 310 are distributed to chargers 2 and 3.

At block 712, the maximum current available from the EVSE is determined. For example, in one embodiment, the current control circuit 404 makes this determination by monitoring the PWM of the pilot signal 304. In another embodiment, the PCU 618 makes this determination by monitoring the CP and PP signals 614.

At block 714, the current for each charger is set based on the maximum available current. For example, the current control circuit 404 sets the duty cycle of the PWM of the secondary pilot signals to set the maximum current for each charger. In another embodiment, the PCU 618 controls the chargers (604, 606) using control bus 620 to set the maximum current for each charger. For example, the PCU 618 sets the current for each charger using the bus 620 (or other communication mechanism) based on maximum available current from the EVSE and also based on battery pack allowable current, SOC, SOH and other system parameters. In exemplary embodiments, the chargers are always controlled via the control bus 620. In an embodiment, controlling the pilot signal may not be enough on its own, but it does provide a safety backstop to avoid over-drawing from the EVSE.

At block 716, all chargers are operated to provide charging power to vehicle. Referring again to FIG. 2, the chargers 1-3 receive their respective Pilot and Prox signals 208 and begin to perform their respective charging functions.

It should be noted that the method 700 is exemplary and that changes, modifications, deletions, or additions to the method operations are within the scope of the exemplary embodiments.

Figure 8:
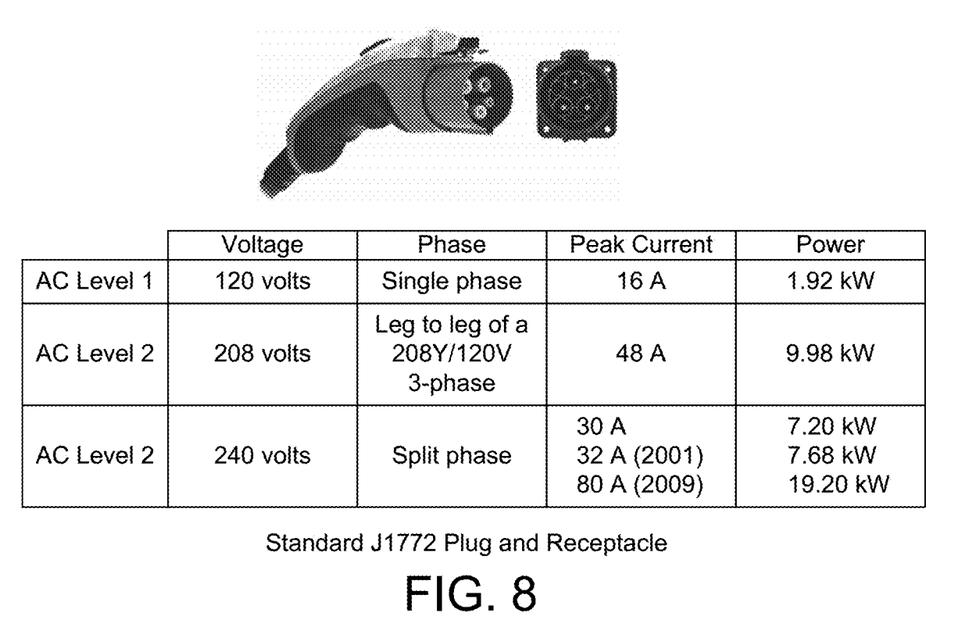
FIG. 8 shows an exemplary embodiment of a J1772 connector for use with embodiments of the charging apparatus disclosed herein.

FIG. 8 shows an embodiment of a standard J1772 plug and receptacle connectors for use with embodiments of the charging apparatuses disclosed herein. Also shown is a table of electrical characteristics associated with use of the connectors. It should be noted that 208 volts is the most common supply for industrial and commercial settings and that 240 volts is the most common for residential settings. It should also be noted that for AC Level 2, 208 volts, 80 amps, and 16.6 kW is also available.

Figure 9:
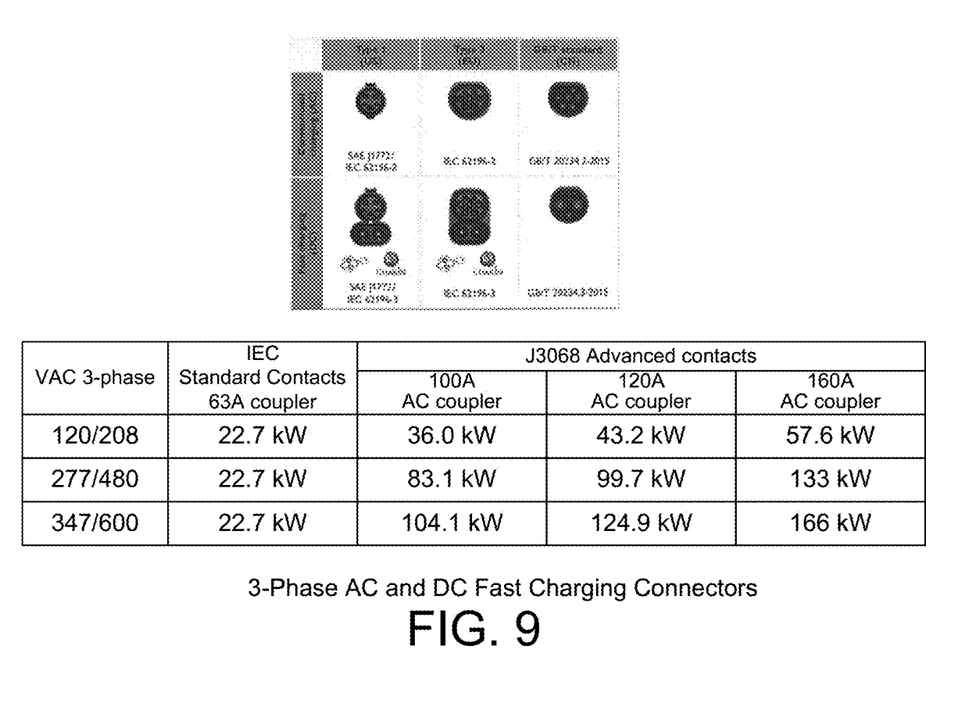
FIG. 9 shows exemplary embodiments of three-phase connectors for use with embodiments of the charging apparatus disclosed herein.

FIG. 9 shows exemplary embodiments of three-phase AC and DC fast-charging connectors that are suitable for use with embodiments of the charging apparatuses disclosed herein.

Although certain specific exemplary embodiments are described above in order to illustrate the invention, the invention is not limited to the specific embodiments. Accordingly, various modifications, adaptations, and combinations of various features of the described embodiments can be practiced without departing from the scope of the invention as set forth in the claims.

What is claimed is:

1. An apparatus, comprising:
   a secondary signal generator (SSG) that receives charging control signals and generates one or more secondary charging control signals; and
   an output circuit that outputs the charging control signals to a primary charging device and the one or more secondary charging control signals to one or more secondary charging devices, wherein the charging control signals comprise a proximity signal and a pilot signal, and wherein the SSG comprises:
      a buffer circuit that receives the proximity signal and generates one or more secondary proximity signals; and
      a comparator circuit that receives the pilot signal and generates one or more secondary pilot signals.

2. The apparatus of claim 1, wherein the SSG comprises a current control circuit that receives the pilot signal and generates one or more secondary pilot signals having one or more pulse width modulations, respectively, and wherein the one or more pulse width modulations control power output from the one or more secondary charging devices, respectively.

3. The apparatus of claim 1, wherein the charging control signals are received from an electric vehicle supply equipment (EVSE).

4. The apparatus of claim 3, further comprising a Society of Automobile Engineers (SAE) J1772 connector that transfers the charging control signals from the EVSE to the SSG.

5. The apparatus of claim 3, wherein the EVSE provides high voltage (HV) charging signals that are coupled to the primary charging device and the one or more secondary charging devices.

6. The apparatus of claim 1, wherein the SSG comprises one or more override circuits that selectively override functions of the SSG.

7. The apparatus of claim 6, wherein the one or more override circuits allow the one or more secondary charging devices to operate when the primary charging device malfunctions.

8. A method, comprising:
   receiving charging control signals, wherein the operation of receiving comprises receiving a proximity signal and a pilot signal as the charging control signals;
   generating one or more secondary charging control signals from the charging control signals, wherein the operation of generating comprises:
      generating one or more secondary proximity signals from the proximity signal; and
      generating one or more secondary pilot signals from the pilot signal;

outputting the charging control signals to a primary charging device;

outputting the one or more secondary charging control signals to one or more secondary charging devices; and selectively overriding the operation of generating the one or more secondary proximity signals from the proximity signal.

9. The method of claim 8, wherein the operation of selectively overriding comprises generating the one or more secondary proximity signals when the primary charging device malfunctions.

10. The method of claim 8, wherein the one or more secondary pilot signals are generated to have one or more pulse width modulations, respectively, and wherein the one or more pulse width modulations control power output from the one or more secondary charging devices, respectively.

11. The method of claim 8, wherein the charging control signals are received from an electric vehicle supply equipment (EVSE).

12. The method of claim 11, wherein the charging control signals are received from the EVSE using a Society of Automobile Engineers (SAE) J1772 connector.

13. The method of claim 11, wherein the operation of receiving comprises:

receiving high voltage (HV) charging signals from the EVSE; and coupling the HV charging signals to the primary charging device and the one or more secondary charging devices.

14. A method, comprising:

receiving a proximity signal and a pilot signal;

generating one or more secondary proximity signals from the proximity signal and generating one or more secondary pilot signals from the pilot signal;

outputting the proximity signal and the pilot signal to a primary charging device;

outputting the one or more secondary proximity signals and the one or more secondary pilot signals to one or more secondary charging devices; and selectively overriding generation of the one or more secondary proximity signals from the proximity signal.

15. The method of claim 14, wherein selectively overriding generation of the one or more secondary proximity signals occurs when the primary charging device malfunctions.

* * * * *